US012228470B2

(12) United States Patent
Peng et al.

(10) Patent No.: US 12,228,470 B2
(45) Date of Patent: Feb. 18, 2025

(54) CONDUCTIVE PASTE FOR PREPARING FLEXIBLE POROUS PIEZORESISTIVE SENSOR, METHOD FOR MAKING SAME AND APPLICATION THEREOF

(71) Applicant: Shenzhen University, Shenzhen (CN)

(72) Inventors: Zhengchun Peng, Shenzhen (CN); Ziya Wang, Shenzhen (CN); Qi Zhang, Shenzhen (CN); Xiao Guan, Shenzhen (CN); Wan'er Lin, Shenzhen (CN); Xiaojun Tian, Shenzhen (CN)

(73) Assignee: Shenzhen University, Nanshan (CN)

( * ) Notice: Subject to any disclaimer, the term of this patent is extended or adjusted under 35 U.S.C. 154(b) by 835 days.

(21) Appl. No.: 17/311,361

(22) PCT Filed: Jan. 29, 2019

(86) PCT No.: PCT/CN2019/073584
§ 371 (c)(1),
(2) Date: Jun. 7, 2021

(87) PCT Pub. No.: WO2020/113807
PCT Pub. Date: Jun. 11, 2020

(65) Prior Publication Data
US 2022/0026298 A1    Jan. 27, 2022

(30) Foreign Application Priority Data
Dec. 7, 2018  (CN) .......................... 201811497628.1

(51) Int. Cl.
*G01L 9/06* (2006.01)
*H01B 1/24* (2006.01)
(52) U.S. Cl.
CPC . *G01L 9/06* (2013.01); *H01B 1/24* (2013.01)

(58) Field of Classification Search
CPC .... G01L 9/06; G01L 1/18; H01B 1/24; H01B 13/00; B81B 3/00; B81C 1/00
See application file for complete search history.

(56) References Cited

U.S. PATENT DOCUMENTS 10,107,827 B1 * 10/2018 Agarwal ................... G01L 1/18
10,259,923 B1 *  4/2019 Phillips .................... C23F 13/06
(Continued)

FOREIGN PATENT DOCUMENTS

CN           1511874          7/2004
CN         102270762 A  * 12/2011  ............... H01B 1/24
(Continued)

OTHER PUBLICATIONS

McCall, R.W. et al., "Piezoelectric Nanoparticle—Polymer Composite Foams", <Advanced Materials>, Oct. 29, 2014, p. 19505, vol. 6, issue (22), Wiley-VCH GmbH, US.
(Continued)

*Primary Examiner* — Jeffrey T Carley
(74) *Attorney, Agent, or Firm* — IPRTOP LLC

(57) ABSTRACT

The present disclosure provides a conductive paste for preparing flexible porous piezoresistive sensor, a method for making the same, and application thereof. The conductive paste includes a conductive carbon material, a sacrificial template and a high molecular polymer matrix. The high molecular polymer matrix includes a high molecular polymer and an organic solvent, and the mass ratio of the high molecular polymer to the organic solvent is 1:2 to 1:3; and based on the total mass of the conductive carbon material, the sacrificial template and the high molecular polymer, the mass percentage of the conductive carbon material is 2%-5%, the mass percentage of the sacrificial template is 75%-85%, and the mass percentage of the high molecular polymer is 10%-23%. This disclosure uses a sacrificial template with adjustable particle size to prepare conductive (Continued)

paste, greatly increasing number of nanopores or micropores after conductive paste is formed into a film.

15 Claims, 4 Drawing Sheets

(56) References Cited

U.S. PATENT DOCUMENTS

| | | | | |
|---|---|---|---|---|
| 2008/0149363 | A1* | 6/2008 | Han | C08K 3/04 |
| | | | | 252/511 |
| 2009/0272946 | A1* | 11/2009 | Lu | H01G 11/38 |
| | | | | 252/502 |
| 2015/0274924 | A1* | 10/2015 | Pandey | C08J 9/0076 |
| | | | | 427/244 |

FOREIGN PATENT DOCUMENTS

| | | | | |
|---|---|---|---|---|
| CN | 102443274 | | 5/2012 | |
| CN | 109192391 | A * | 1/2019 | ............ H01B 13/00 |
| CN | 109659096 | A * | 4/2019 | ............... H01B 1/22 |
| EP | 2374842 | A1 * | 10/2011 | ............... H01B 1/24 |
| WO | WO-2005119772 | A2 * | 12/2005 | ............ B82Y 10/00 |
| WO | WO-2015115102 | A1 * | 8/2015 | ............. C01B 32/05 |

OTHER PUBLICATIONS

Wu, Shuying et al., "Porous PDMS/CNFS Composites for Stretchable Strain sensors", <21st International Conference on Composite Materials Xi'an>, Aug. 25, 2017, p. 3, China Academic Journals (CD Edition) Electronic Publishing House Co., Ltd, CN.

Fan, Junyou et al., "Stretchable Porous Carbon Nanotube-Elastomer Hybrid Nanocomposite for Harvesting Mechanical Energy", <Advanced Materials>, Nov. 21, 2016, pp. 6-7, vol. 29, issue (2), Wiley-VCH GmbH, US.

* cited by examiner

CONDUCTIVE PASTE FOR PREPARING FLEXIBLE POROUS PIEZORESISTIVE SENSOR, METHOD FOR MAKING SAME AND APPLICATION THEREOF

CROSS REFERENCES TO RELATED APPLICATIONS

This is a Sect. 371 National Stage application of a PCT International Application No. PCT/CN2019/073584, filed on Jan. 29, 2019, which claims priority of a Chinese Patent Applications No. 2018114976281, filed on Dec. 7, 2018, the content of which is hereby incorporated by reference in its entirety for all purposes.

TECHNICAL FIELD

The present disclosure relates to a pressure sensitive material used in a piezoresistive sensor, a method for making the same and application thereof, and in particular, to a conductive paste for preparing flexible porous piezoresistive sensors, a method for making same and application thereof.

BACKGROUND

Flexible piezoresistive sensors are one of the key devices for wearable devices, robotic electronic skin, and implantable devices. Traditional semiconductor devices represented by silicon materials are limited in the application of the above-mentioned fields due to the limitations of complex processing technology, high equipment investment costs, heavy environmental pollution and lack of flexibility. Compared with photolithography, printing technology can fabricate electronic devices on flexible substrates, and has the advantages of simple processing technology and low equipment cost. Therefore, printed electronics based on organic semiconductor materials and functional nanomaterials have developed rapidly in recent years.

Sensor devices based on piezoresistive effect have the advantages of high sensitivity, simple structure, easy-to-read signal, and endurance to noise. The change in contact resistance between conductive materials of a piezoresistive sensor is in direct proportion to the square root of the applied pressure. Generally, in order to improve the sensitivity of a piezoresistive sensor, a piezoresistive material with a high resistance is required, at the cost of high power consumption. Another effective measure is to create more microporous structures in the piezoresistive materials. However, the currently reported methods for fabricating microporous structures are difficult to implement and the effect is not obvious. Therefore, it is of great application value to develop a highly conductive printing paste with easy preparation and controllable pore size and to print such paste directly on any electrode to obtain flexible and even stretchable pressure sensing devices.

In Chinese Patent Publication CN103528722, a flexible pressure sensor is formed by printing a support of conductive ink on the surface of a textile. The support is flexible, stretchable and elastic. A plurality of primary traces of stretchable and elastic conductive ink or conductive paste are printed on the support. The process mainly uses conductive ink to form a piezoresistive pressure device on the surface of the fabric. There is not much breakthrough in the printing paste, and the performance of the sensor is mainly limited by the fabric material. Chinese Patent Publication CN101586992 discloses a method for preparing a pressure sensor with a nano-SiC thin film, in which the nano-SiC thin film is prepared by screen printing and sintering. Such a thin-film sensor improves its sensitivity mainly by back-end circuit design. It has a limited range of pressure sensitivity and is not stretchable.

SUMMARY

In view of the shortcomings of the prior art mentioned above, the present disclosure provides a conductive paste for preparing flexible porous piezoresistive sensors, a method for making the same, and application thereof. The conductive paste includes a conductive carbon material, a sacrificial template and a high molecular polymer matrix. This disclosure uses a sacrificial template with adjustable particle size to prepare conductive paste, which can greatly increase the number of nanopores or micropores after the conductive paste is formed into a film. Under the action of pressure, the conductive particles around the pores are in contact with each other, which effectively reduces the conductivity of the material, thereby improving the sensitivity of the flexible piezoresistive sensor. The adjustable pore size helps to adjust the sensitivity range, as well as the measurement range, and can be used in different practical applications. The conductive paste is printable, which provides a guarantee for a low-cost and high-efficiency sensor preparation process. At the same time, the conductive paste with adjustable viscosity provides multiple options for device design and processing.

In order to achieve the above objectives and other related objectives, the present disclosure is achieved through the following technical solutions:

In a first aspect, as shown in FIG. 7, the present disclosure provides a conductive paste for preparing flexible porous piezoresistive sensors, including a conductive carbon material, a sacrificial template and a high molecular polymer matrix. The high molecular polymer matrix includes a high molecular polymer and an organic solvent, and the mass ratio of the high molecular polymer to the organic solvent is 1:2 to 1:3, for example, 1:2 to 1:2.2, 1:2.2 to 1:2.4, 1:2.4 to 1:2.5, 1:2.5 to 1:2.7 or 1:2.7 to 1:3. Based on the total mass of the conductive carbon material, the sacrificial template and the high molecular polymer, the mass percentage of the conductive carbon material is 2%-5%, for example, 2%-3%, 3%-4% or 4%-5%; the mass percentage of the sacrificial template is 75%-85%, for example, 75%-77%, 77%-81%, 81%-82% or 82%-85%; and the mass percentage of the high molecular polymer is 10%-23%, for example, 10%-14%, 14%-15%, 15%-20%, 20%-22% or 22%-23%.

The viscosity of the conductive paste may be adjusted by an organic solvent to meet the requirements of device printing or printing preparation.

Preferably, at least one of the following technical features is included:

1) The conductive carbon material is selected from one or more of conductive carbon black, carbon nanotubes, and graphene;
2) The sacrificial template is selected from one or more of sodium chloride and sucrose;
3) The particle size of the sacrificial template is 50 μm-500 μm, for example, 50 μm-100 μm, 100 μm-150 μm, 150 μm-300 μm, 300 μm-400 μm, or 400 μm-500 μm;
4) The high molecular polymer is selected from one or more of polyurethane elastomer, polydimethylsiloxane elastomer, and polyolefin elastomer;
5) The organic solvent is selected from one or more of dimethylformamide, methylbenzene and ethyl acetate.

More preferably, Feature 1) further includes at least one of the following technical features:
1) The conductive carbon black is spherical nanoscale conductive carbon black particles with a particle size of 20 nm-100 nm;
2) The carbon nanotube has a diameter of 3 nm-80 nm and a length of 5 μm-30 μm;
3) The sheet diameter of the graphene is less than 10 μm, and the number of layers is 1-20.

In a second aspect, the present disclosure provides a method for making the above-mentioned conductive paste. The conductive paste is obtained by mixing the conductive carbon material, the sacrificial template, and the high molecular polymer matrix according to the composition ratio of the conductive paste.

Preferably, the following operations are included:

In the first operation, obtaining a mixed solid by mixing the conductive carbon material with the sacrificial template according to the composition ratio of the conductive paste;

In the second operation, obtaining the conductive paste by mixing the mixed solid obtained in the first operation with the high molecular polymer matrix according to the composition ratio of the conductive paste.

In a third aspect, the present disclosure provides the use of the above-mentioned conductive paste for preparing a flexible porous piezoresistive sensor.

In a fourth aspect, the present disclosure provides a method for making a porous conductive sensing layer of a flexible piezoresistive sensor, including:

In the first operation, printing the conductive paste to make the sensing layer, and then curing;

In the second operation, immersing the sensing layer obtained in the first operation in water and removing the sacrificial template by dissolution to obtain the porous conductive sensing layer.

Preferably, the method further includes evaporating the solution in which the sacrificial template is dissolved in the second operation to regain the sacrificial template.

In a fifth aspect, the present disclosure provides a porous conductive sensing layer obtained by the above-mentioned method.

In a sixth aspect, the present disclosure provides a method for making a flexible porous piezoresistive sensor, including:

In the first operation, printing a conductive electrode on a flexible substrate;

In the second operation, printing the conductive paste to make the sensing layer on the conductive electrode, and then curing;

In the third operation, immersing the device obtained in the second operation in water and removing the sacrificial template by dissolution to obtain the flexible porous piezoresistive sensor.

Preferably, the method further includes evaporating the solution in which the sacrificial template is dissolved in the third operation to regain the sacrificial template.

Compared with prior art, the present disclosure has the following advantages:

The conductive paste is prepared by using the sacrificial template with adjustable particle sizes, so that the number of nanopores or micropores after the conductive paste is formed into a film can be greatly increased. The present disclosure adopts conductive carbon material that, in cooperation with the high-density microporous structure, can improve the sensitivity of the flexible piezoresistive sensor, and greatly reduce the power consumption of the sensor. The adjustable pore size helps to adjust the sensitivity and measurement range of the sensor, and can be used in different practical applications. The conductive paste is printable, which provides a guarantee for a high-efficiency and low-cost preparation process. At the same time, the conductive paste with adjustable viscosity provides a variety of options for device design and processing.

DETAILED DESCRIPTION OF THE PREFERRED EMBODIMENTS

The technical solution of the present disclosure will be described below through exemplary embodiments. It should be understood that one or more method steps mentioned in the present disclosure are not exclusive of other method steps that may exist before or after the combined steps or that other method steps may be inserted between these explicitly mentioned steps; it should also be understood that the embodiments are just for describing the present disclosure instead of limiting the scope of the present disclosure. Moreover, unless otherwise stated, the numbering of each method step is only a convenient tool for identifying each method step, and is not intended to limit the order of each method step or to limit the scope of the present disclosure. The change or adjustment of the relative relationships between the steps shall also be regarded as the scope in which the present disclosure may be implemented without substantially changing the technical content.

Embodiment 1

Conductive carbon black particles with a particle size of 20 nm-100 nm are prepared by a method similar to the furnace black method. Industrial sodium chloride particles are put into a ball mill for ball-milling at a speed of 500 r/min for 20 min to obtain sodium chloride particles with a diameter of about 100 μm. The ball-to-material ratio is about 1:1. The first part: mixing the ball-milled sodium chloride particles and carbon black particles at a mass ratio of 81:4 and stirring evenly. The second part: dissolving the thermoplastic polyurethane elastomer rubber particles (Elastollan 35A, BASF, Germany) into the dimethylformamide solvent (the mass ratio of the thermoplastic polyurethane elastomer rubber particles to the dimethylformamide solvent is 1:2), mixing and stirring evenly under closed conditions and placing for more than 24 hours. Mixing the first part and the second part uniformly with planetary stirring at a mass ratio of 85:15 to obtain a conductive paste for preparing a flexible porous piezoresistive sensor.

Figure 1:
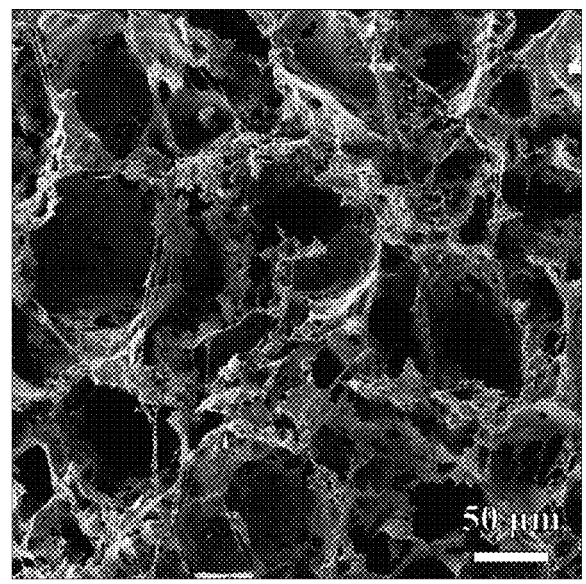
FIG. 1 is an SEM image of the microstructure of the conductive paste in Embodiment 1 after the sacrificial template is cured and removed.

After printing and curing the above-mentioned conductive paste, the conductive paste is immersed in water for repeated desalination (sodium chloride) treatment. A SEM image of the microstructure of the conductive paste after the sacrificial template is removed is shown in FIG. 1. A stretchable pressure sensor can be constructed by accessing an electrode.

Embodiment 2

Based on the above-mentioned conductive paste, a flexible porous piezoresistive sensor is prepared by coating, 3D printing, or screen printing. The method is as follows:

By using coating, 3D printing, or screen printing processes, a flexible elastic substrate with designed size and shape is coated or printed on any planar substrate;

The designed conductive electrode is printed on the flexible elastic substrate, and the conductive paste obtained in Embodiment 1 is used to print a single-layer or multi-layer overlapping sensing layer of any shape. After curing, the entire device is immersed in water for desalination treatment. 3D printing or screen printing devices can be customized in size and shape.

The flexible elastic substrate is made of thermoplastic polyurethane elastomer rubber particles, with an organic solvent to adjust viscoelasticity. The above-mentioned conductive electrode is prepared by mixing 80% silver micron with a polymer consistent with the substrate. The viscosity of the conductive electrode is adjusted by using an organic solvent. The sensing layer is composed of 6 layers of bow-shape sensing materials. The adjacent layers are staggered to form a net structure, and the total thickness of the sensing layer is about 2 mm.

Figure 2:
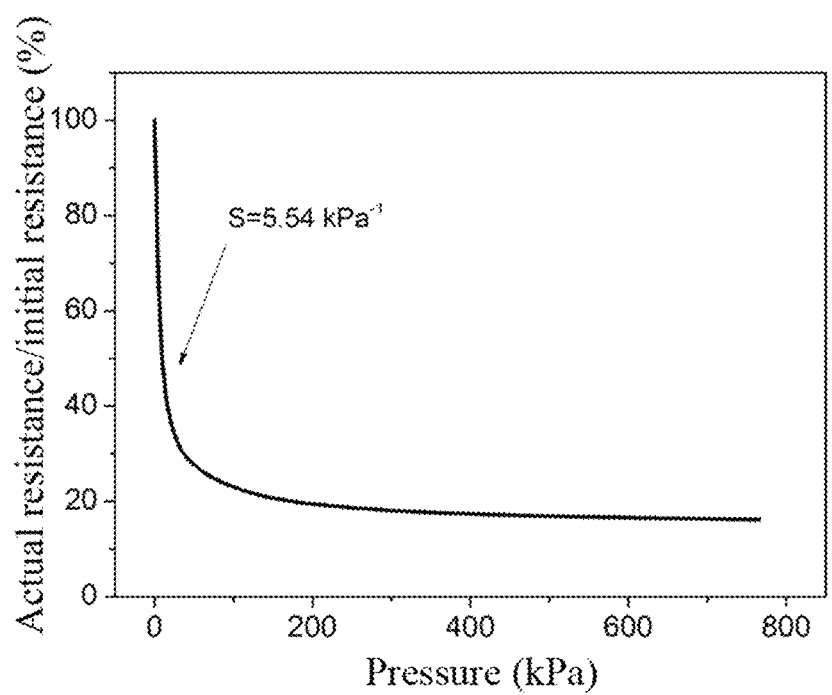
FIG. 2 is a pressure-resistance change curve of the flexible porous piezoresistive sensor in Embodiment 1.

FIG. 2 is a pressure-resistance change curve of the sensor obtained by the above-mentioned preparation method. Within the range of 20 kPa, the sensitivity of the sensor is 5.54 kpa$^{-1}$. At the same time, the sensor can measure pressures of approximately 800 kPa.

Embodiment 3

The first part: mixing and stirring evenly the sodium chloride particles with a particle size of about 400 μm and conductive carbon black with a particle size of 20 nm-100 nm at a mass ratio of 75:2. The second part: dissolving the polydimethylsiloxane elastomer (Sylgard 184, Dow Corning) into the methylbenzene solvent (the mass ratio of the polydimethylsiloxane elastomer to the methylbenzene solvent is 1:2.5), mixing and stirring evenly under closed conditions and placing for more than 24 hours. Mixing the first part and the second part evenly by planetary stirring at a mass ratio of 77:23 to obtain a conductive paste for preparing a flexible porous piezoresistive sensor.

Figure 3:
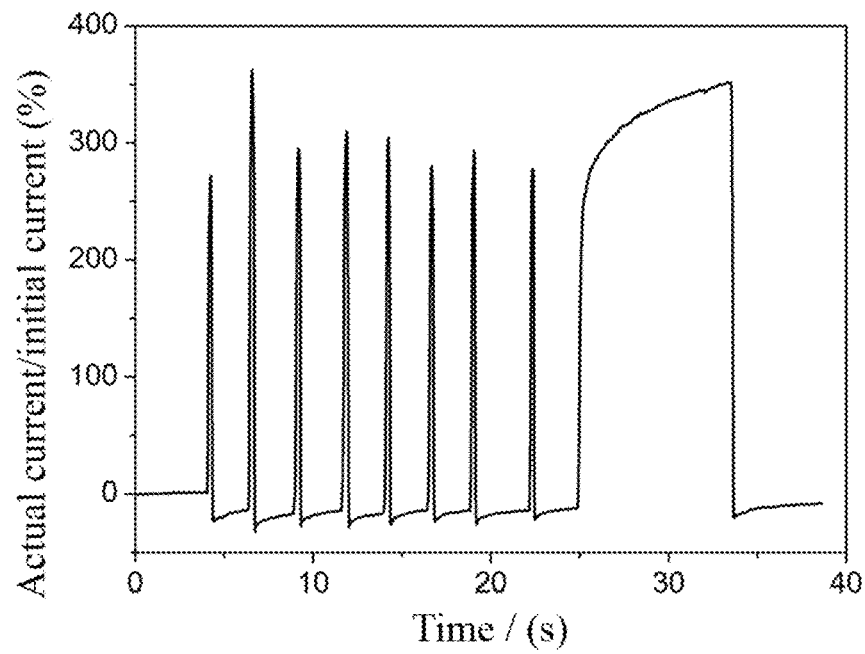
FIG. 3 is a finger-tap-test signal diagram of the flexible porous piezoresistive sensor in Embodiment 3.

The flexible porous piezoresistive sensor is prepared according to the method of Embodiment 2. The response diagram of the sensor under a slight finger pressure (not a fixed frequency) is shown in FIG. 3.

Embodiment 4

The first part: mixing and stirring evenly the sodium chloride particles with a particle size of about 50 μm and carbon nanotubes (diameter of 3 nm-80 nm, length of 5 μm-30 μm) at a mass ratio of 82:4. The second part: dissolving the polyolefin elastomer (such as SEBS, TPE, SBS) into the ethyl acetate solvent (the mass ratio of the polyolefin elastomer to the ethyl acetate solvent is 1:2.2), mixing and stirring evenly under closed conditions and placing for more than 24 hours to obtain a conductive paste for preparing a flexible porous piezoresistive sensor. Mixing the first part and the second part evenly by planetary stirring at a mass ratio of 86:14 to obtain a conductive paste for preparing a flexible porous piezoresistive sensor.

Figure 4:
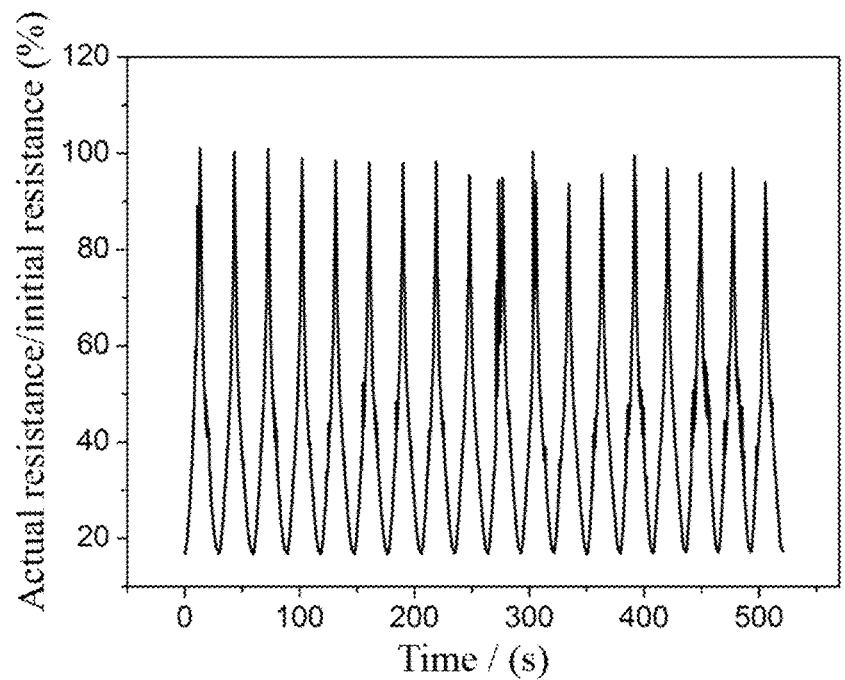
FIG. 4 shows the experimental test data of the flexible porous piezoresistive sensor in Embodiment 4 under ~800 kPa and at a fixed frequency.

The flexible porous piezoresistive sensor is prepared according to the method of Embodiment 2. The experimental test data of the sensor under 50 N (~800 kPa) and a fixed frequency is shown in FIG. 4.

Embodiment 5

The first part: mixing and stirring evenly the sucrose with a particle size of about 300 μm and carbon nanotubes (diameter of 3 nm-80 nm, length of 5 μm-30 μm) at a mass ratio of 77:3. The second part: dissolving the thermoplastic polyurethane elastomer rubber particles (Elastollan 35A, BASF, Germany) into the methylbenzene solvent (the mass ratio of the thermoplastic polyurethane elastomer rubber particles to the methylbenzene solvent is 1:2.7), mixing and stirring evenly under closed conditions and placing for more than 24 hours to obtain a conductive paste for preparing a flexible porous piezoresistive sensor. Mixing the first part and the second part evenly by planetary stirring at a mass ratio of 80:20 to obtain a conductive paste for preparing a flexible porous piezoresistive sensor.

Figure 5:
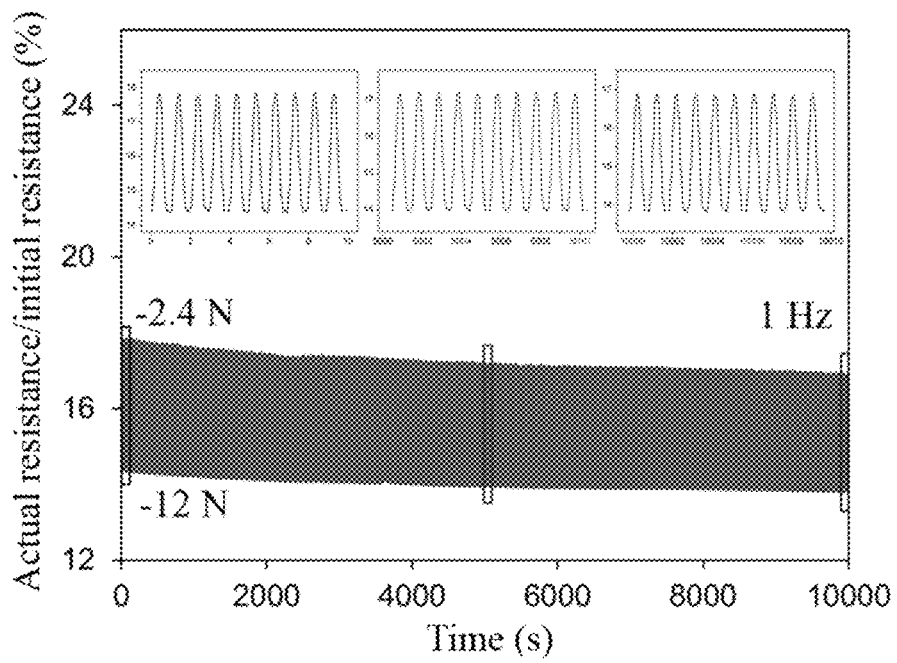
FIG. 5 shows the fatigue test data of the flexible porous piezoresistive sensor in Embodiment 5 under the pressure of ~150 kPa.

The flexible piezoresistive porous sensor is prepared according to the method of Embodiment 2. The fatigue test data of the sensor over 10,000 times under 9.6 N (~150 kPa) is shown in FIG. 5.

Embodiment 6

The first part: mixing and stirring evenly the sucrose with a particle size of about 150 μm and the graphene sheets (sheet diameter <10 μm, layer number of 1-20) at a mass ratio of 85:5. The second part: dissolving the polydimethylsiloxane elastomer (Sylgard 184, Dow Corning) into the ethyl acetate solvent (the mass ratio of the polydimethylsiloxane elastomer to the ethyl acetate solvent is 1:2.4), mixing and stirring evenly under closed conditions and placing for more than 24 hours to obtain a conductive paste for preparing a flexible porous piezoresistive sensor. Mixing the first part and the second part evenly by planetary stirring at a mass ratio of 90:10 to obtain a conductive paste for preparing a flexible porous piezoresistive sensor.

Figure 6:
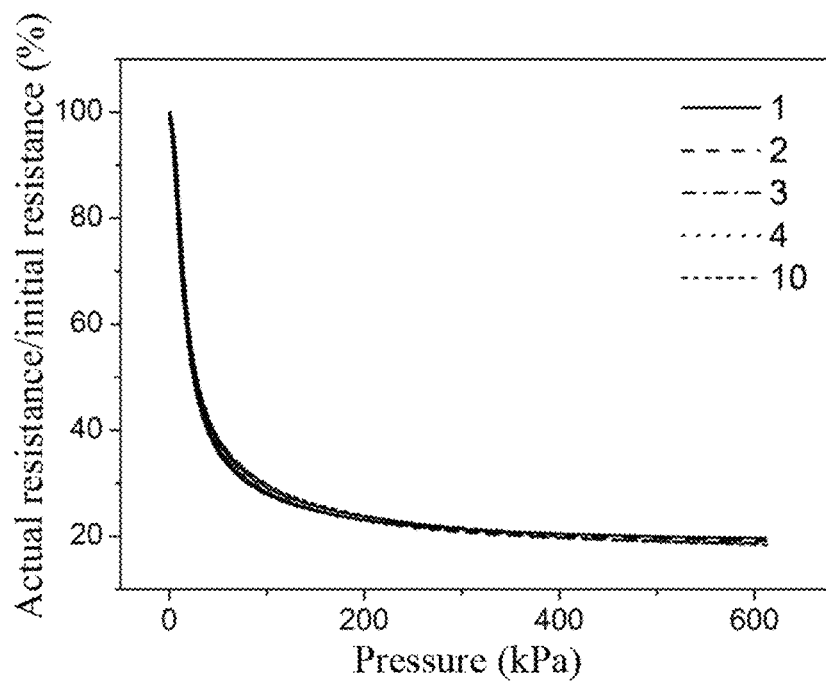
FIG. 6 shows the cyclic test data of the flexible porous piezoresistive sensor in Embodiment 6 under the pressure of ~600 kPa.
Figure 7:
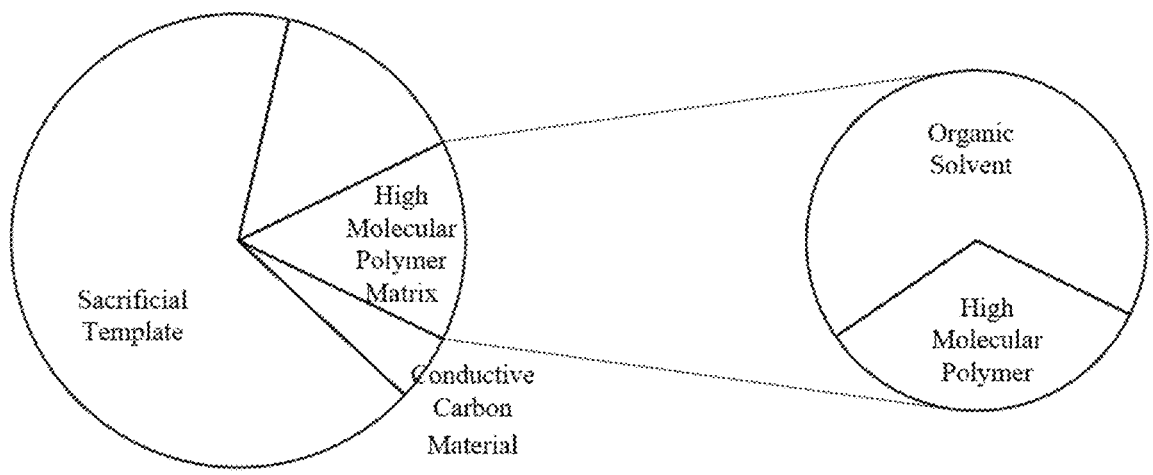
FIG. 7 shows an exemplary composition of a conductive paste according to an embodiment of the present disclosure.

The flexible porous piezoresistive sensor is prepared according to the method of Embodiment 2. The cyclic test data of the sensor under the pressure of ~600 kPa is shown in FIG. 6.

Embodiment 7

The first part: mixing and stirring evenly the sucrose with a particle size of about 500 μm and the graphene sheets (sheet diameter <10 μm, layer number of 1-20) at a mass ratio of 75:3. The second part: dissolving the polyolefin elastomer (such as SEBS, TPE, SBS) into the dimethylformamide solvent (the mass ratio of the polyolefin elastomer to the dimethylformamide solvent is 1:3), mixing and stirring evenly under closed conditions and placing for more than 24 hours to obtain a conductive paste for preparing a flexible porous piezoresistive sensor. Mixing the first part and the second part evenly by planetary stirring at a mass ratio of 78:22 to obtain a conductive paste for preparing a flexible porous piezoresistive sensor.

The flexible porous piezoresistive sensor prepared according to the method of Embodiment 2 has the same performance data as that in FIG. 3 and FIG. 5.

The above are only some preferred embodiments of the present disclosure instead of limitations on the present disclosure in any form or substance. It should be noted that, for those skilled in the art, improvements and supplements may be made without departing from the method of the present disclosure, the improvements and supplements shall also be covered by the protection of the present disclosure. The equivalent changes of alternations, modifications and evolutions can be made by those skilled in the art using the technical contents revealed above and without departing from the spirit and scope of the present disclosure, and those equivalent changes are regarded as equivalent embodiments of the present disclosure. Meanwhile, any alterations, modifications, and evolutions of any equivalent changes made to the above embodiments according to the essential technology of the present disclosure still fall within the scope of the technical solution of the present disclosure.

The invention claimed is:

1. A conductive paste for preparing a flexible porous piezoresistive sensor, the conductive paste comprising a conductive carbon material, a sacrificial template and a high molecular polymer matrix, the high molecular polymer matrix includes a high molecular polymer and an organic solvent, and the mass ratio of the high molecular polymer to the organic solvent is 1:2 to 1:3; based on the total mass of the conductive carbon material, the sacrificial template and the high molecular polymer, the mass percentage of the conductive carbon material is 2%-5%, the mass percentage of the sacrificial template is 75%-85%, and the mass percentage of the high molecular polymer matrix is 10%-23%.

2. The conductive paste according to claim 1, wherein:
1) the conductive carbon material is selected from one or more of a conductive carbon black, a carbon nanotube, and a graphene sheet;
2) the sacrificial template is selected from one or more of sodium chloride and sucrose;
3) a particle size of the sacrificial template is 50 μm-500 μm;
4) the high molecular polymer is selected from one or more of polyurethane elastomer, polydimethylsiloxane elastomer, and polyolefin elastomer; and
5) the organic solvent is selected from one or more of dimethylformamide, methylbenzene and ethyl acetate.

3. The conductive paste according to claim 2, wherein:
1) the conductive carbon black is spherical nanoscale conductive carbon black particles with a particle size of 20 nm-100 nm;
2) the carbon nanotube has a diameter of 3 nm-80 nm and a length of 5 μm-30 μm; and
3) the sheet diameter of the graphene sheet is less than 10 μm, and the number of layers is 1-20.

4. A method for preparing the conductive paste of claim 1, wherein the conductive paste is obtained by mixing the conductive carbon material, the sacrificial template, and the high molecular polymer matrix according to a composition ratio of the conductive paste.

5. The method for preparing the conductive paste according to claim 4, comprising:
in a first operation, obtaining a mixed solid by mixing the conductive carbon material with the sacrificial template according to the composition ratio of the conductive paste;
in a second operation, obtaining the conductive paste by mixing the mixed solid obtained in the first operation with the high molecular polymer matrix according to the composition ratio of the conductive paste.

6. A method for preparing a porous conductive sensing layer of a flexible piezoresistive sensor, comprising:
in a first operation, printing the conductive paste of claim 1 to prepare the sensing layer, and then curing;
in a second operation, immersing the sensing layer obtained in the first operation in water and removing the sacrificial template by dissolution to obtain the porous conductive sensing layer.

7. The method for preparing the porous conductive sensing layer according to claim 6, further comprising evaporating the solution in which the sacrificial template is dissolved in the second operation, to regain the sacrificial template.

8. A method for preparing a flexible porous piezoresistive sensor, comprising:
in a first operation, printing a conductive electrode on a flexible substrate;
in a second operation, printing the conductive paste of claim 1 to prepare a sensing layer on the conductive electrode, and then curing;
in a third operation, immersing a device obtained in the second operation in water and removing the sacrificial template by dissolution to obtain the flexible porous piezoresistive sensor.

9. The method for preparing the flexible porous piezoresistive sensor according to claim 8, further comprising evaporating the solution in which the sacrificial template is dissolved in the third operation, to regain the sacrificial template.

10. A method for preparing the conductive paste of claim 2, wherein the conductive paste is obtained by mixing the conductive carbon material, the sacrificial template, and the high molecular polymer matrix according to a composition ratio of the conductive paste.

11. A method for preparing the conductive paste of claim 3, wherein the conductive paste is obtained by mixing the conductive carbon material, the sacrificial template, and the high molecular polymer matrix according to a composition ratio of the conductive paste.

12. A method for preparing a porous conductive sensing layer of a flexible piezoresistive sensor, comprising:
in a first operation, printing the conductive paste of claim 2 to prepare the sensing layer, and then curing;
in a second operation, immersing the sensing layer obtained in the first operation in water and removing the sacrificial template by dissolution to obtain the porous conductive sensing layer.

13. A method for preparing a porous conductive sensing layer of a flexible piezoresistive sensor, comprising:
in a first operation, printing the conductive paste of claim 3 to prepare the sensing layer, and then curing;
in a second operation, immersing the sensing layer obtained in the first operation in water and removing the sacrificial template by dissolution to obtain the porous conductive sensing layer.

14. A method for preparing a flexible porous piezoresistive sensor, comprising:
in a first operation, printing a conductive electrode on a flexible substrate;

in a second operation, printing the conductive paste of claim 2 to prepare a sensing layer on the conductive electrode, and then curing;

in a third operation, immersing a device obtained in the second operation in water and removing the sacrificial template by dissolution to obtain the flexible porous piezoresistive sensor.

15. A method for preparing a flexible porous piezoresistive sensor, comprising:

in a first operation, printing a conductive electrode on a flexible substrate;

in a second operation, printing the conductive paste of claim 3 to prepare a sensing layer on the conductive electrode, and then curing;

in a third operation, immersing a device obtained in the second operation in water and removing the sacrificial template by dissolution to obtain the flexible porous piezoresistive sensor.

* * * * *